United States Patent
Soundararajan et al.

(10) Patent No.: US 10,484,001 B1
(45) Date of Patent: Nov. 19, 2019

(54) MULTI-BIT SUCCESSIVE-APPROXIMATION REGISTER ANALOG-TO-DIGITAL CONVERTER

(71) Applicant: TEXAS INSTRUMENTS INCORPORATED, Dallas, TX (US)

(72) Inventors: Rishi Soundararajan, Bengaluru (IN); Visvesvaraya Pentakota, Bengaluru (IN); Anand Jerry George, Calicut (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/221,464

(22) Filed: Dec. 15, 2018

(30) Foreign Application Priority Data

Oct. 31, 2018 (IN) .............................. 201841041190

(51) Int. Cl.
| | |
|---|---|
| H03M 1/46 | (2006.01) |
| H03M 1/68 | (2006.01) |
| H03M 1/12 | (2006.01) |
| H03M 1/06 | (2006.01) |

(52) U.S. Cl.
CPC ......... *H03M 1/468* (2013.01); *H03M 1/0639* (2013.01); *H03M 1/0675* (2013.01); *H03M 1/1245* (2013.01); *H03M 1/68* (2013.01)

(58) Field of Classification Search
None
See application file for complete search history.

(56) References Cited

U.S. PATENT DOCUMENTS

| | | | |
|---|---|---|---|
| 6,894,627 B2 | 5/2005 | Janakiraman et al. | |
| 10,020,816 B1* | 7/2018 | Cleris | ...................... H03M 1/38 |
| 10,218,376 B1* | 2/2019 | Collins | ................... H03M 1/66 |
| 2013/0120171 A1* | 5/2013 | Dinc | ................... H03M 1/0641 |
| | | | 341/110 |
| 2016/0336952 A1 | 11/2016 | Srinivasa et al. | |

* cited by examiner

*Primary Examiner* — Howard Williams
(74) *Attorney, Agent, or Firm* — John R. Pessetto; Charles A. Brill; Frank D. Cimino

(57) ABSTRACT

A system for digitizing a sampled input value includes a digital-to-analog converter for generating an output signal as a function of (1) the sampled input value, (2) a reference value, and (3) digital codes, and a multi-bit analog-to-digital converter for determining the digital codes in first, intermediate, and subsequent cycles. Dither is dynamically added to the digital-to-analog converter in the intermediate cycle. The dither is corrected for in the subsequent cycle.

20 Claims, 2 Drawing Sheets

US 10,484,001 B1

MULTI-BIT SUCCESSIVE-APPROXIMATION REGISTER ANALOG-TO-DIGITAL CONVERTER

This application claims priority to Indian Patent Application No. 201841041190, filed Oct. 31, 2018. The entire disclosure of Indian Patent Application No. 201841041190 is hereby fully incorporated herein by reference.

BACKGROUND

An analog-to-digital (A/D) converter (ADC) may be used to generate digital codes which represent the level of an analog signal. An analog-to-digital converter may be configured to operate in an iterative fashion, using a successive-approximation register (SAR) and a digital-to-analog (D/A) converter (DAC). An analog-to-digital converter which uses a successive-approximation register to develop a sequence of digital codes is referred to herein as a successive-approximation register analog-to-digital converter. The digital-to-analog converter for a successive-approximation register analog-to-digital converter may have one or more capacitor arrays, as illustrated, for example, in U.S. Pat. No. 6,894,627 and U.S. Patent Application Publication No. 2016/0336952. The entire disclosures of U.S. Pat. No. 6,894,627 and U.S. Patent Application Publication No. 2016/0336952 are hereby fully incorporated herein by reference.

SUMMARY

This disclosure relates to a system for digitizing a sampled input value. The device includes a digital-to-analog converter for generating an output signal as a function of (1) the sampled input value, (2) a reference value, and (3) digital codes, and a multi-bit analog-to-digital converter for determining the digital codes in first, intermediate, and subsequent cycles. Dither is dynamically added to the digital-to-analog converter in the intermediate cycle. The dither is corrected for in the subsequent cycle.

This disclosure also relates to a method of digitizing an analog input voltage. The method includes sampling the input voltage, and then, in a first cycle, using a capacitor array to generate a first output voltage as a function of (1) the input voltage, (2) a reference voltage, and (3) digital codes, and using a multi-bit successive-approximation register analog-to-digital converter to determine first digital codes, and then, in an intermediate cycle, dynamically adding dither to a capacitor of the capacitor array to reduce the formation of higher-order harmonics in an output signal, using the capacitor array to generate an intermediate output voltage as a function of the input voltage, a reference voltage, and the first digital codes, and using the multi-bit successive-approximation register analog-to-digital converter to determine second digital codes. After the second cycle, the capacitor array is used to generate a subsequent output voltage as a function of the input voltage, a reference voltage, and the first and second digital codes, and the multi-bit successive-approximation register analog-to-digital converter is used to determine a third digital code for correcting the second digital codes, and then the first, second, and third digital codes are used to cause the output signal to be representative of the input voltage.

DETAILED DESCRIPTION

Figure 1:
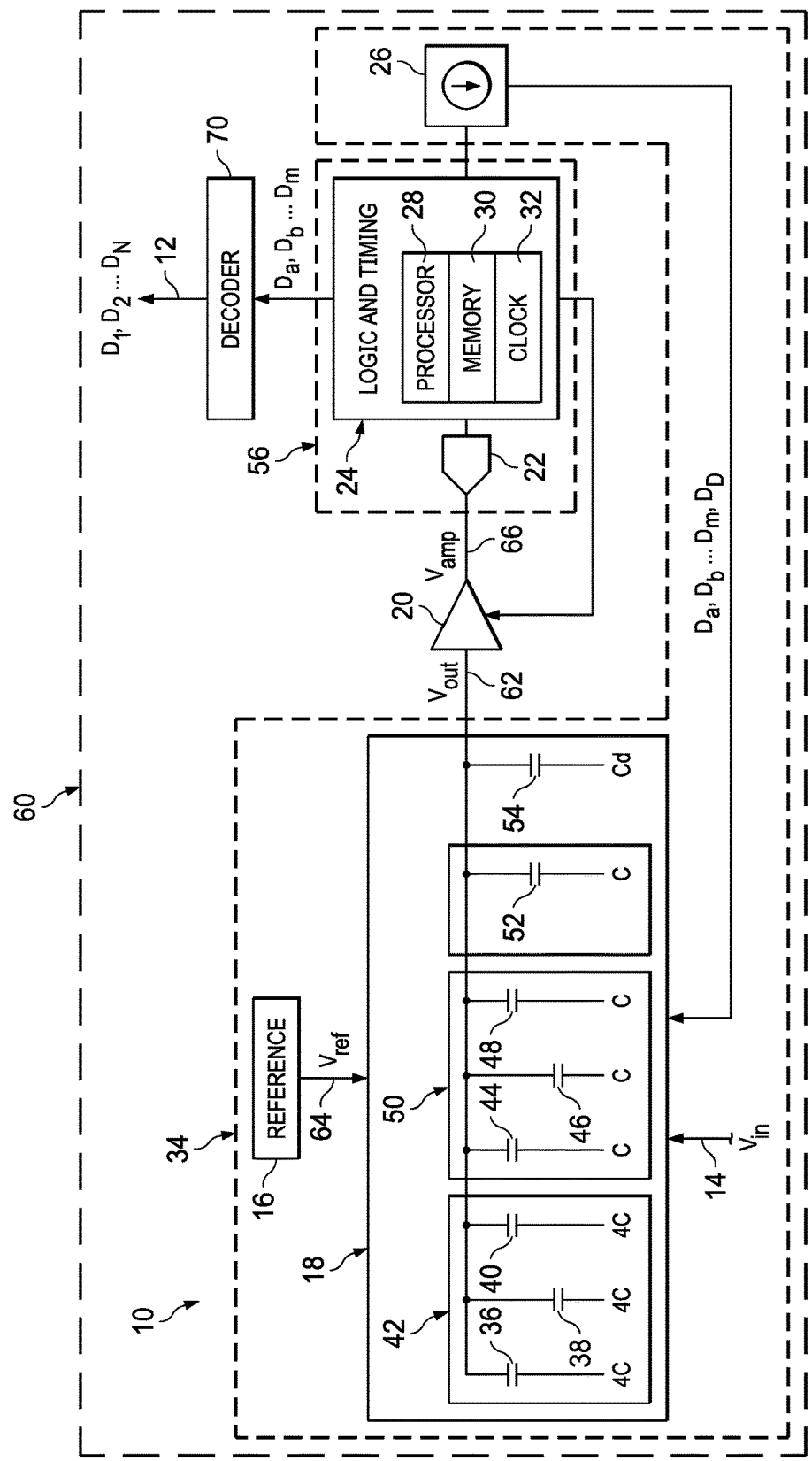
FIG. 1 is a block diagram of a multi-bit successive-approximation register analog-to-digital converter system constructed in accordance with one example of this disclosure.

Referring now to the drawings, where like reference numerals designate like elements and steps, there is shown in FIG. 1 an analog-to-digital converter system 10 for generating and outputting binary digital codes $D_1, D_2 \ldots D_N$ on an output line 12. The output codes $D_1, D_2 \ldots D_N$ are digital representations of a sampled voltage $V_{in}$ on an analog input line 14. The system 10 has a reference source 16, a capacitor array 18, an amplifier 20, a multi-bit flash-type analog-to-digital converter 22, a logic and timing circuit 24, and a steering current source 26. The logic and timing circuit 24 has a processor 28, a memory 30, and a clock signal generator 32.

The reference source 16, the capacitor array 18, and the current source 26 are elements of a digital-to-analog converter 34. In the illustrated example, the capacitor array 18 has three 4C capacitors 36, 38, 40 which constitute a most-significant-bit (MSB) sub-array 42, three C capacitors 44, 46, 48 which constitute a least-significant-bit (LSB) sub-array 50, an additional C capacitor 52, and a dither capacitor 54. The analog-to-digital converter 22 and the logic and timing circuit 24 are elements of a successive-approximation register system 56.

A mismatch between two or more capacitors in an array can create several higher-order harmonics (undesirable noise) in an output spectrum. The problem may be caused by any capacitor array, no matter how small. As a practical matter, even a small number of capacitors which are nominally the same will have some mismatch. However, the problem may be even more prominent for a device or system which is intended to have high resolution (for example, greater than ten bits). If not controlled, the higher-order harmonics can cause the device or system to exhibit unsatisfactory spurious free dynamic range (SFDR) and/or can adversely impact the integral/differential non-linearity (INL/DNL) of the system.

Thus, because the capacitors 36, 38, 40, 44, 46, 48, 52 of the capacitor array 18 cannot be all the same, but include random and/or purposeful differences, the capacitor array 18 is susceptible to producing several higher-order harmonics. According to one aspect of this disclosure, the higher-order harmonics are reduced or eliminated in an uncomplicated and convenient manner.

This disclosure may be implemented in a variety of configurations and is not limited to the specific configuration illustrated in FIG. 1. In particular, without limiting the generality of the foregoing, this disclosure is not limited to the details of the capacitor array 18. Other arrays containing more or fewer capacitors of different characteristics, with or without capacitor arrays split by a coupling capacitor, and/or configured in different ways relative to the input voltage $V_{in}$ and a reference voltage, may be employed with other elements to achieve advantages over the prior art in line with this disclosure.

All of the components of the analog-to-digital converter system 10 may be connected to or integrated into an integrated circuit (IC) chip 60 fabricated according to various semiconductor and/or other processes. One or more of the conductive lines 12, 14 and other devices and elements 34, 56 of the analog-to-digital converter system 10 may be diffused or implanted into one or more layers of semiconductor material (not illustrated). The integrated devices and elements 34, 56 include transistors, resistors, and other suitable electronic devices that are not shown in the drawings for the sake of clarity.

Figure 3:
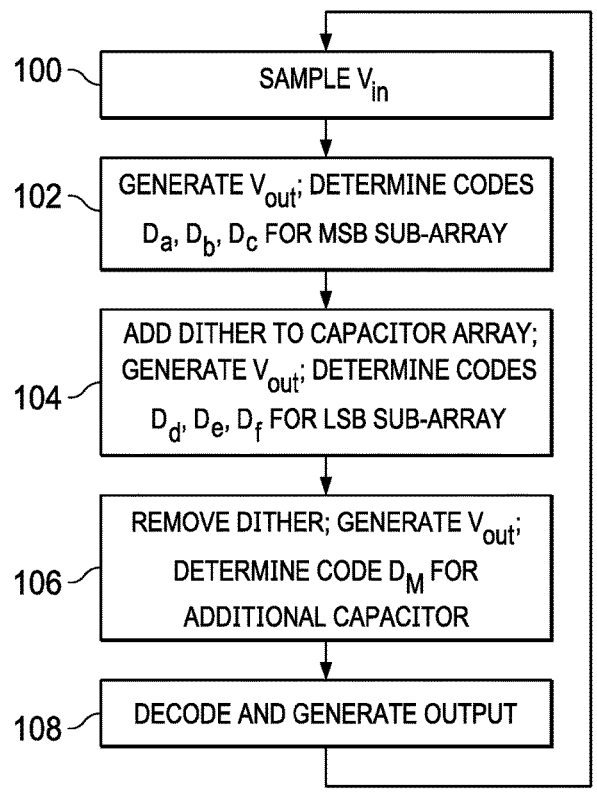
FIG. 3 is a flowchart for a method of operating the analog-to-digital converter system of FIG. 1.

In operation, at a timing that is determined by the logic and timing circuit 24, with reference to the clock signal generator 32, the capacitor array 18 samples and holds the input voltage $V_{in}$ (Step 100, FIG. 3). Then, at the start of a conversion phase, and at the beginning of a first successive-approximation register cycle (Step 102), voltages are selectively applied to the bottom plates of the capacitors 36, 38, 40, 44, 46, 48, 52, 54 (FIG. 1) based on digital codes $D_a$, $D_b$ ... $D_M$, $D_D$ generated by the logic and timing circuit 24 (as described in more detail below), which causes an output voltage $V_{out}$ to be applied to the amplifier 20 on a line 62.

The output voltage $V_{out}$ is a function of (1) the sampled input voltage $V_{in}$, (2) a reference voltage $V_{ref}$, and (3) the codes $D_a$, $D_b$ ... $D_M$, $D_D$ which determine the voltages that are applied to the bottom plates of the capacitors 36, 38, 40, 44, 46, 48, 52, 54. The reference voltage $V_{ref}$ (an example of a reference value) is received from the reference source 16 on a line 64. The output voltage $V_{out}$ (an example of an output signal) is adjusted by the capacitors 36, 38, 40, 44, 46, 48, 52, 54 under the influence of the codes $D_a$, $D_b$ ... $D_M$, $D_D$; that is, the output $V_{out}$ of the capacitor array 18 is operationally responsive to the codes $D_a$, $D_b$ ... $D_M$, $D_D$.

In the illustrated example, the codes $D_a$, $D_b$ ... $D_M$ that are generated for the capacitors 36, 38, 40 of the most-significant-bit sub-array 42, the capacitors 44, 46, 48 of the least-significant-bit sub-array 50, and the additional C capacitor 52 are any one of 1, 0, and −1. The corresponding voltages that are applied to the bottom plates of the sub-array capacitors 36, 38, 40, 44, 46, 48 and the additional capacitor 52 are $V_{ref}$, 0, and $-V_{ref}$, respectively. The code $D_D$ that is generated for the dither capacitor 54 is 0 during the first cycle, so that the voltage that is applied to the bottom plate of the dither capacitor 54 during the first cycle is 0.

Although the codes $D_a$, $D_b$ ... $D_M$ are thermometric in the illustrated example, an alternative system with binary capacitors may be operated with binary codes. In general, the manner in which the output voltage $V_{out}$ is determined as a function of the sampled input voltage $V_{in}$, and in which the codes are determined by a successive-approximation register system, may be implemented in various configurations. However, according to this disclosure, during the first successive-approximation register cycle (Step 102), the code $D_D$ applied to the dither capacitor 48 is 0. That is, according to this disclosure, no noise is added to the capacitor array 18 during the first cycle.

Then, at a timing that is determined by the logic and timing circuit 24, the amplifier 20 generates an amplified voltage $V_{amp}$ (an example of an amplified signal), based on the output voltage $V_{out}$, and applies the amplified voltage $V_{amp}$ to the flash-type analog-to-digital converter 22, on a line 66. The gain applied by the amplifier 20 may be different for different cycles of the system 10, under the control of the logic and timing circuit 24. In the illustrated example, the analog-to-digital converter 22 includes cascading high-speed comparators (not illustrated), and generates the thermometric digital codes $D_a$, $D_b$ ... $D_M$ that are applied to the bottom plates of the sub-array capacitors 36, 38, 40, 44, 46, 48 and the additional capacitor 52.

This disclosure is not limited, however, to the illustrated flash-type converter 22. Other converters may be used in connection with this disclosure to generate various thermometric or binary codes, for two or more bits of analog-to-digital resolution, to successively approximate a value that corresponds to the sampled input voltage $V_{in}$ (an example of a sampled input value).

Figure 2:
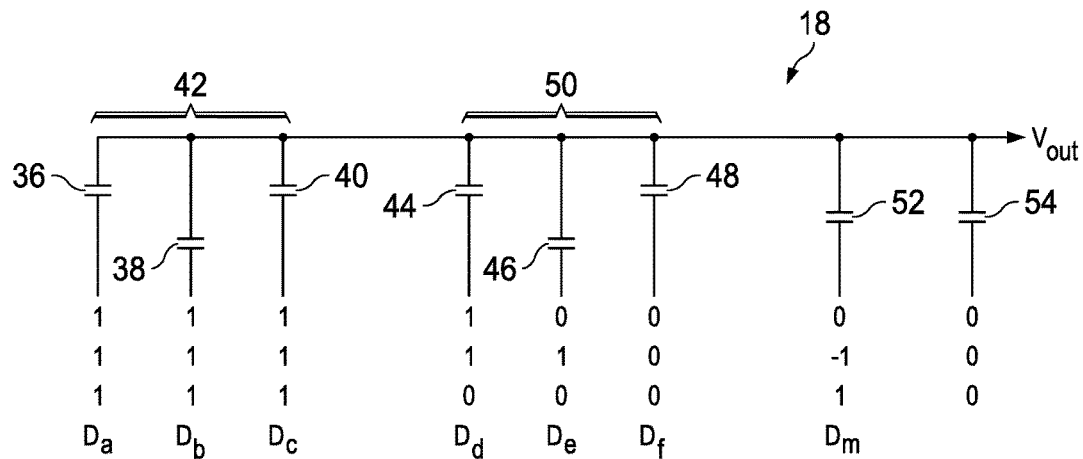
FIG. 2 shows three sets of thermometric codes determined for a single input value, under three different operational conditions, where one of the conditions is a comparative example, and the other two conditions are examples in accordance with this disclosure.

During the first successive-approximation cycle, new codes $D_a$, $D_b$, ... $D_c$ for the most-significant-bit sub-array 42 are determined. As illustrated in FIG. 2, for example, the most-significant-bit codes $D_a$, $D_b$, $D_c$ may be determined to be 1 1 1. Then, at the beginning of a second successive-approximation register cycle (Step 104), voltages are selectively applied to the bottom plates of the capacitors 36, 38, 40, 44, 46, 48, 52, 54 based on (1) the newly-determined codes $D_a$, $D_b$, $D_c$, (2) other digital codes $D_d$, $D_e$ ... $D_M$ generated by the logic and timing circuit 24, and (3) a non-zero dither code $D_D$, and then a second output voltage $V_{out}$ is applied to the amplifier 20.

In the examples illustrated in FIG. 2, during the second successive-approximation register cycle, the most-significant bit codes $D_a$, $D_b$, $D_c$ are set at 1 1 1 (that is, at the values determined during the first successive-approximation register cycle), the least-significant-bit codes $D_d$, $D_e$, $D_f$ for the least-significant-bit capacitors 44, 46, 48 are successively determined by the logic and timing unit 24, and the dither code is 1 or −1 (not 0).

A predetermined dither voltage ($V_{ref}$ or $-V_{ref}$, depending on whether the dither code $D_D$ is 1 or −1) is added (applied) to the dither capacitor 54 throughout the second successive-approximation register cycle. According to this disclosure, the predetermined dither voltage ($V_{ref}$ or $-V_{ref}$) does not have to be accurately determined because it is removed during the third and any subsequent successive-approximation register cycle, as described in more detail below. As a result of applying the dither voltage ($V_{ref}$ or $-V_{ref}$) to the bottom plate of the dither capacitor 54, the least-significant bit codes $D_d$, $D_e$, $D_f$ determined during the second successive-approximation register cycle (Step 104) do not accurately represent the sampled input voltage Vi.

In the example illustrated in FIG. 2, if no dither were applied to the capacitor array 18 at any time, then the least-significant-bit codes $D_d$, $D_e$, $D_f$, determined during the second successive-approximation register cycle, would be 1 0 0 (shown in the first line of FIG. 2). However, because dither is applied during the second successive-approximation register cycle, the least-significant-bit codes $D_d$, $D_e$, $D_f$ are determined to be 1 1 0 or 0 0 0, depending on whether the applied dither is $V_{ref}$ or $-V_{ref}$, respectively.

Then, at the beginning of a third, and any subsequent, successive-approximation register cycle (Step 106), voltages are selectively applied to the bottom plates of the sub-array capacitors 36, 38, 40, 44, 46, 48 based on the codes determined during the first and second cycles, a voltage is applied to the bottom plate of the additional capacitor 52 based on a digital code $D_M$ generated by the logic and timing circuit 24, and no dither voltage is applied to the dither capacitor 54.

As a result, a third output voltage $V_{out}$ is applied to the amplifier 20. In the examples shown in the second and third lines of FIG. 2, during the third, and any subsequent, successive-approximation register cycle, the most-significant-bit codes $D_a$, $D_b$, $D_c$ are set at 1 1 1 (as determined during the first cycle), the least-significant-bit codes $D_d$, $D_e$, $D_f$ are set at 1 1 0 or 0 0 0 (as determined during the second cycle), and a code $D_M$ for the additional capacitor 52 is determined by the logic and timing unit 24.

The additional code $D_M$ may be determined using the current steering source 26 (IDAC), or through a resistor ladder (RDAC) (not shown). The system 10 illustrated in FIG. 1 utilizes the redundancy in the successive-approximation register cycles to correct for the mismatch in the capacitor array 18.

The dither code $D_D$ during the third, and any subsequent, successive-approximation register cycle is 0. That is, no dither is applied to the capacitor array 18 during any successive-approximation register cycle after the second (or intermediate) cycle. As a result, the additional code $D_M$ determined during the third, and any subsequent, cycle corrects for the least-significant-bit codes $D_d$, $D_e$, $D_f$ (1 1 0 or 0 0 0 in the examples illustrated in the second and third lines of FIG. 2) determined during the second cycle.

Referring again to the comparative example illustrated in the first line of FIG. 2, recall that if no dither is ever applied to the capacitor array 18, then the least-significant-bit codes $D_d$, $D_e$, $D_f$ determined during the second cycle would be 1 0 0. However, because dither is applied during the second cycle, but not during the third, or any subsequent cycle, the sum of the least-significant-bit codes $D_d$, $D_e$, $D_f$ determined during the second cycle (1 1 0 or 0 0 0) and the additional code $D_M$ determined during the third, and any subsequent, cycle (−1 or 1) converges toward the least-significant-bit codes that would be determined if no dither were ever applied, but in a different configuration (in the examples illustrated in FIG. 2: 1 1 0 −1 or 0 0 0 1, instead of 1 0 0 0).

Thus, the dither that is applied to the digital-to-analog converter 34 in one or more intermediate cycles (Step 104) is corrected for in one or more subsequent cycles (Step 106). By dynamically applying dither only during the second (or intermediate) successive-approximation registration cycle (or, at least not during the first and last cycles), the dither can be used to eliminate or reduce higher-order harmonics, and the redundancy of the system 10 and/or error correction logic of the logic and timing circuit 24 can sufficiently correct for a coding error that would otherwise occur. The architecture of the multi-bit successive-approximation register analog-to-digital converter 10 has redundancy to account for digital-to-analog converter settling errors and comparator offsets. That redundancy can be used in accordance with this disclosure to sufficiently correct for coding errors that are induced by dither.

If the dither were applied throughout the process, starting with the first successive-approximation register cycle, then accurate subtraction could be needed to remove the applied dither. In order to perform that subtraction operation, the value of the added dither would have to be known, which could require calibration of the dither capacitor 54. According to the present disclosure, it may not be necessary to accurately subtract out any applied dither, or to calibrate the dither capacitor 54.

After the third, or any subsequent, successive-approximation register cycle, according to timing controlled by the logic and timing circuit 24, a decoder 70 (FIG. 1) decodes the finally-determined thermometric codes $D_a$, $D_b$ . . . $D_M$ into the desired binary codes $D_1$, $D_2$ . . . $D_N$ and outputs the binary codes $D_1$, $D_2$ . . . $D_N$ on line 12 (Step 108), and then a next voltage on the input line 12 is sampled by the capacitor array 18 (Step 100). Then, the successive-approximation register analog-to-digital conversion process (Steps 102, 104, 106, 108) is repeated.

According to this disclosure, dither can be added and later removed, for each sampled voltage, and the redundancy of the system 10 can be employed to correct for the dynamically applied dither. In the illustrated example, the final output (on line 12) does not have dither information in it and therefore the dither capacitor 54 does not have to be calibrated.

As used herein, the word "dither" (as a noun) means noise that is intentionally added, or is intended to be added, to a digital signal or process, and (as a verb) means to intentionally add noise to a digital signal or process. The term "dither capacitor" means a capacitor whose sole or primary function is to add noise to a digital signal or electronic process. The term "dither voltage" means a voltage which is added to a digital signal or electronic process solely or primarily to add noise to the signal or the process, and the term "dither code" means thermometric, binary, or other information which is generated and applied for the sole or primary purpose of controlling a device for adding noise to a digital signal or electronic process.

The system 10 described herein may be used, if desired, to perform low power 18/16 bit, 65 mega-samples per second (MSPS), analog-to-digital conversions, but may be scaled to lower sampling rates. The system 10 may also be used, if desired, to support 14 bit, 125 mega-samples per second, analog-to-digital conversions. This disclosure is not limited, however, to the illustrated system 10.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A system for digitizing a sampled input value, comprising:
    a digital-to-analog converter for generating an output signal as a function of (1) the sampled input value, (2) a reference value, and (3) digital codes; and
    a multi-bit analog-to-digital converter for determining the digital codes in first, intermediate, and subsequent cycles;
    wherein dither is dynamically added to the digital-to-analog converter in the intermediate cycle, and corrected for in the subsequent cycle.

2. The system of claim 1, wherein the digital-to-analog converter includes capacitors for adjusting the output signal under the control of the digital codes.

3. The system of claim 2, further comprising an amplifier for amplifying the output signal and for applying an amplified signal to the analog-to-digital converter.

4. The system of claim 3, wherein the analog-to-digital converter includes a logic and timing circuit for controlling the amplifier and for applying the digital codes to the capacitors of the digital-to-analog converter.

5. The system of claim 4, wherein the logic and timing circuit causes a dither voltage to be applied to one of the capacitors during the intermediate cycle, and wherein the dither voltage is not applied to the capacitors before or after the intermediate cycle.

6. A system for digitizing an analog input voltage, comprising:
    a digital-to-analog converter for generating an output voltage as a function of (1) the input voltage, (2) a reference voltage, and (3) digital codes, wherein the digital-to-analog converter includes a capacitor array which is responsive to the digital codes; and a multi-bit successive-approximation register analog-to-digital converter for receiving the output voltage and determining the digital codes based on the output voltage in first, intermediate, and subsequent cycles;

wherein the capacitor array has a dither capacitor to which dither is dynamically added during the intermediate cycle; and wherein dither is not applied to the dither capacitor during the subsequent cycle, and wherein the digital codes are corrected for by the analog-to-digital converter during the subsequent cycle.

7. The system of claim 6, further comprising an input line for supplying the input voltage to the digital-to-analog converter.

8. The system of claim 7, wherein the capacitor array further includes most-significant-bit capacitors, least-significant-bit capacitors, and an additional capacitor, and wherein least-significant-bit codes for the least-significant-bit capacitors are determined during the intermediate cycle while dither is applied to the dither capacitor, and wherein a digital code for correcting the least-significant-bit codes is determined during the subsequent cycle while dither is not applied to the dither capacitor.

9. The system of claim 8, further comprising an amplifier for amplifying the output voltage and applying an amplified voltage to the analog-to-digital converter.

10. The system of claim 9, wherein the analog-to-digital converter includes a flash device for receiving the amplified voltage.

11. The system of claim 9, further comprising a steering current source for applying a digital code to the capacitor array.

12. The system of claim 9, wherein the analog-to-digital converter includes a logic and timing circuit for controlling gain of the amplifier.

13. A method of digitizing an analog input voltage, comprising:

sampling the input voltage;

subsequently, in a first cycle, using a capacitor array to generate a first output voltage as a function of (1) the input voltage, (2) a reference voltage, and (3) digital codes, and using a multi-bit successive-approximation register analog-to-digital converter to determine first digital codes;

subsequently, in an intermediate cycle, dynamically adding dither to a capacitor of the capacitor array to reduce the formation of higher-order harmonics in an output signal, using the capacitor array to generate an intermediate output voltage as a function of the input voltage, a reference voltage, and the first digital codes, and using the multi-bit successive-approximation register analog-to-digital converter to determine second digital codes;

subsequently, using the capacitor array to generate a subsequent output voltage as a function of the input voltage, a reference voltage, and the first and second digital codes, and using the multi-bit successive-approximation register analog-to-digital converter to determine a third digital code for correcting the second digital codes; and subsequently, using the first, second, and third digital codes to cause the output signal to be representative of the input voltage.

14. The method of claim 13, further comprising sampling a new input voltage and applying the new input voltage to the capacitor array.

15. The method of claim 13, wherein the capacitor array includes most-significant-bit capacitors, least-significant-bit capacitors, and an additional capacitor, and wherein least-significant-bit codes for the least-significant-bit capacitors are determined during the intermediate cycle while dither is applied to the capacitor array, and wherein a digital code for correcting the least-significant-bit codes is determined during the subsequent cycle while dither is not applied to the capacitor array.

16. The method of claim 13, further comprising amplifying the output voltages and applying amplified voltages to the analog-to-digital converter.

17. The system of claim 16, further comprising using a logic and timing circuit for controlling gain of the amplifier.

18. The method of claim 17, wherein the analog-to-digital converter includes a flash device for receiving the amplified voltage.

19. The method of claim 13, further comprising using a steering current source for applying the third digital code to the capacitor array.

20. The method of claim 13, wherein the causing of the output signal to be representative of the input voltage includes decoding the first, second, and third digital codes.

* * * * *